United States Patent
Heydari

(10) Patent No.: US 10,136,559 B2
(45) Date of Patent: Nov. 20, 2018

(54) LIQUID-ASSISTED AIR COOLING OF ELECTRONIC RACKS WITH MODULAR FAN AND HEAT EXCHANGERS

(71) Applicant: Baidu USA LLC, Sunnyvale, CA (US)

(72) Inventor: Ali Heydari, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 67 days.

(21) Appl. No.: 15/187,539

(22) Filed: Jun. 20, 2016

(65) Prior Publication Data

US 2017/0367222 A1    Dec. 21, 2017

(51) Int. Cl.
*H05K 7/20*    (2006.01)

(52) U.S. Cl.
CPC ..... *H05K 7/20736* (2013.01); *H05K 7/20172* (2013.01); *H05K 7/20781* (2013.01); *H05K 7/20836* (2013.01)

(58) Field of Classification Search
CPC ............... H05K 7/2079; H05K 7/1497; H05K 7/20736; H05K 7/20781; H05K 7/20836; H05K 7/20745; H05K 7/20572; H05K 7/20645; H05K 7/16; H05K 7/00; H05K 5/00; H05K 7/20172; B60K 11/04; B60K 11/06; B60H 1/004; G06F 1/16; G06F 1/20
See application file for complete search history.

(56) References Cited

U.S. PATENT DOCUMENTS

| | | | | |
|---|---|---|---|---|
| 2,741,398 A | * | 4/1956 | Riener | B65D 45/20 220/318 |
| 4,819,827 A | * | 4/1989 | DiSesa | B65D 25/2852 220/318 |
| 5,335,722 A | * | 8/1994 | Wu | H01L 23/467 165/122 |
| 6,109,340 A | * | 8/2000 | Nakase | H01L 23/467 165/121 |
| 6,137,680 A | * | 10/2000 | Kodaira | H01L 23/4093 165/104.34 |
| 6,950,306 B2 | * | 9/2005 | Huang | H01L 23/467 257/706 |
| 6,978,827 B2 | * | 12/2005 | Armstrong | H01L 23/4093 165/121 |

(Continued)

*Primary Examiner* — Robert J Hoffberg
(74) *Attorney, Agent, or Firm* — Womble Bond Dickinson (US) LLP

(57) ABSTRACT

An electronic rack includes a stack of one or more information technology (IT) components disposed therein to form a frontend and a backend of the electronic rack. The electronic rack further includes a fan unit detachably mounted on the backend of the electronic rack. The fan unit generates an air flow flowing from the frontend to the backend past through an air space of the stack of IT components to reduce a temperature of the IT components. The electronic rack further includes a heat exchange unit detachably mounted on the backend of the electronic rack to exchange heat generated from the IT components. The heat exchange unit includes one or more tubes forming a heat exchange screen. The one or more tubes allow a cool liquid to travel therein to exchange the heat carried by the air flow past through the heat exchange screen.

24 Claims, 14 Drawing Sheets

(56) References Cited

U.S. PATENT DOCUMENTS

| | | | | |
|---|---|---|---|---|
| 7,034,418 B2* | 4/2006 | Matsumoto | F04D 25/0613 | 165/121 |
| 7,123,483 B2* | 10/2006 | Otsuki | H01L 23/467 | 361/710 |
| 7,405,934 B2* | 7/2008 | Otsuki | F04D 29/582 | 165/80.3 |
| 7,854,652 B2* | 12/2010 | Yates | E04H 5/02 | 361/690 |
| 7,963,119 B2* | 6/2011 | Campbell | G06F 1/20 | 165/104.33 |
| 8,251,785 B2* | 8/2012 | Schmitt | H05K 7/1497 | 361/695 |
| 9,013,873 B2* | 4/2015 | Wei | G06F 1/20 | 361/696 |
| 9,016,352 B2* | 4/2015 | Helbig | F28F 9/007 | 165/67 |
| 2004/0079100 A1* | 4/2004 | Monfarad | F04B 35/045 | 62/259.2 |
| 2004/0163403 A1* | 8/2004 | Monfarad | F25B 1/00 | 62/259.2 |
| 2007/0135032 A1* | 6/2007 | Wang | F24F 9/00 | 454/184 |
| 2009/0198388 A1* | 8/2009 | Hillis | H05K 7/1497 | 700/300 |
| 2010/0110626 A1* | 5/2010 | Schmitt | H05K 7/20745 | 361/679.47 |
| 2010/0314080 A1* | 12/2010 | Cao | G06F 1/20 | 165/121 |
| 2011/0175498 A1* | 7/2011 | Bash | F24F 11/0001 | 312/107 |
| 2013/0111937 A1* | 5/2013 | Hendrix | G06F 1/20 | 62/127 |
| 2014/0190198 A1* | 7/2014 | Slessman | H05K 7/20836 | 62/314 |
| 2014/0319146 A1* | 10/2014 | Ye | A47J 36/10 | 220/318 |
| 2016/0113149 A1* | 4/2016 | Krug, Jr. | H05K 7/20781 | 361/679.53 |
| 2017/0105317 A1* | 4/2017 | Heydari | H05K 7/2079 | |

* cited by examiner

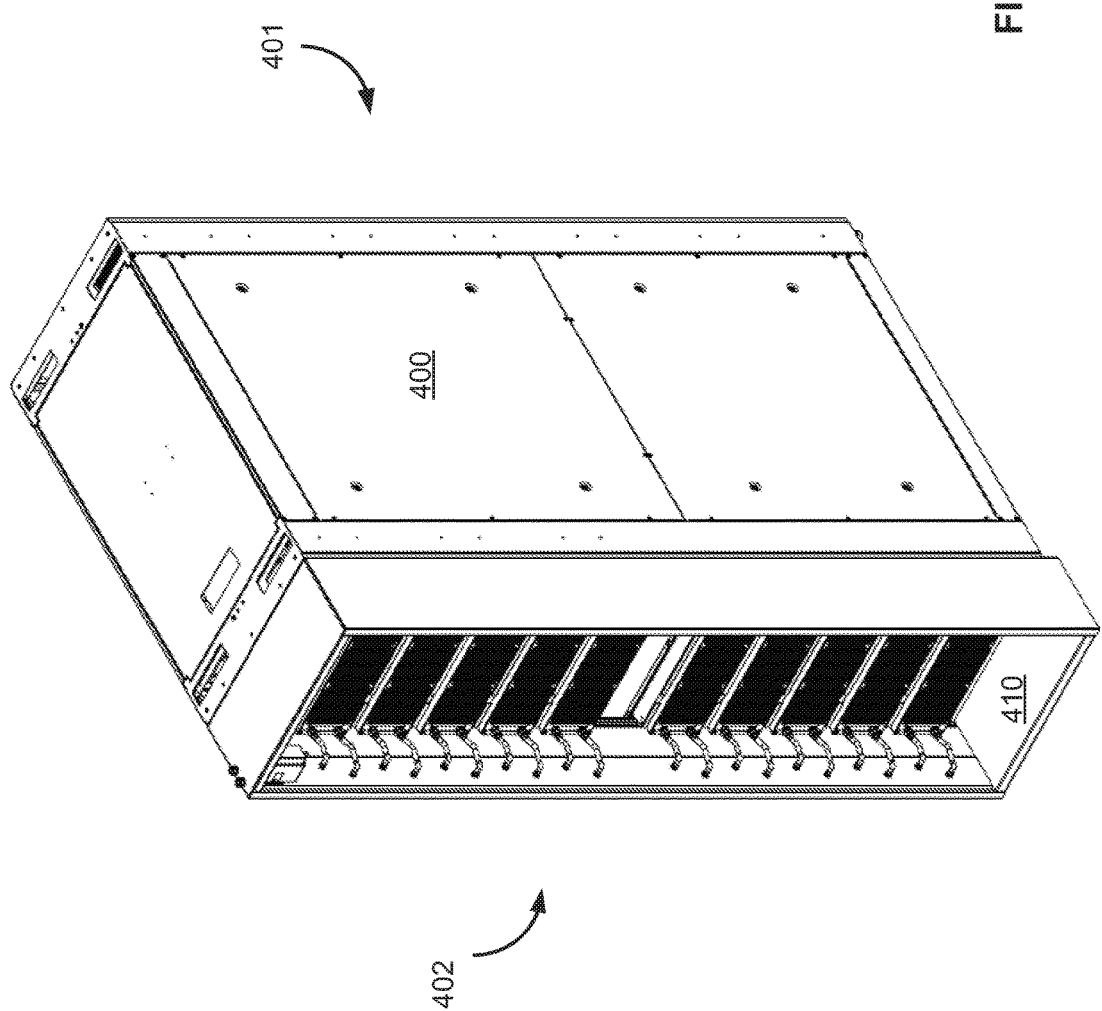

LIQUID-ASSISTED AIR COOLING OF ELECTRONIC RACKS WITH MODULAR FAN AND HEAT EXCHANGERS

FIELD OF THE INVENTION

Embodiments of the present invention relate generally to data centers. More particularly, embodiments of the invention relate to a liquid-assisted cooling system for cooling electronic racks of IT components in a data center.

BACKGROUND

Heat removal is a prominent factor in computer system and data center design. The number of information technology (IT) components such as servers deployed within a data center has steadily increased as the server performance has improved, thereby increasing the amount of heat generated during the ordinary operation of the servers. The reliability of servers used within a data center decreases if the environment in which they operate is permitted to increase in temperature over time. A significant portion of the data center's power is used for cooling electronics at the server level. As the number of servers within a data center increases, a greater portion of the power is commensurately consumed by the data center to cool electronic components within the servers.

In conventional data center structures, a computer room air conditioner (CRAC) circulates cold air throughout a data center. Conventionally, the CRAC is a closed-loop system that cools returning air drawn from within the data center and recirculates the cooled air to the servers within the data center. Because air drawn by the CRAC originates within the data center, the air has an increased temperature from cooling the servers in the data center. Certain conventional data centers utilize heat exchangers disposed on the top of electronic racks. However such a configuration may cause maintenance problems such as liquid leakage, which may damage the IT components or elements. Further, such a design is inefficient in a modular data center configuration.

BRIEF DESCRIPTION OF THE DRAWINGS

Embodiments of the invention are illustrated by way of example and not limitation in the figures of the accompanying drawings in which like references indicate similar elements.

FIGS. 4A-4B are perspective views of an electronic rack according to one embodiment of the invention.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, an electronic rack includes a stack of one or more information technology (IT) components disposed therein to form a frontend and a backend of the electronic rack. The electronic rack further includes a fan unit detachably mounted on the backend of the electronic rack. The fan unit generates an air flow flowing from the frontend to the backend past through an air space of the stack of IT component to reduce a temperature of the IT components. The electronic rack further includes a heat exchange unit detachably mounted on the backend of the electronic rack to exchange heat generated from the IT components. The heat exchange unit includes one or more tubes forming a heat exchange screen. The one or more tubes allow a cool liquid to travel therein to exchange the heat carried by the air flow generated by the fan unit and passed through the heat exchange screen.

Figure 1:
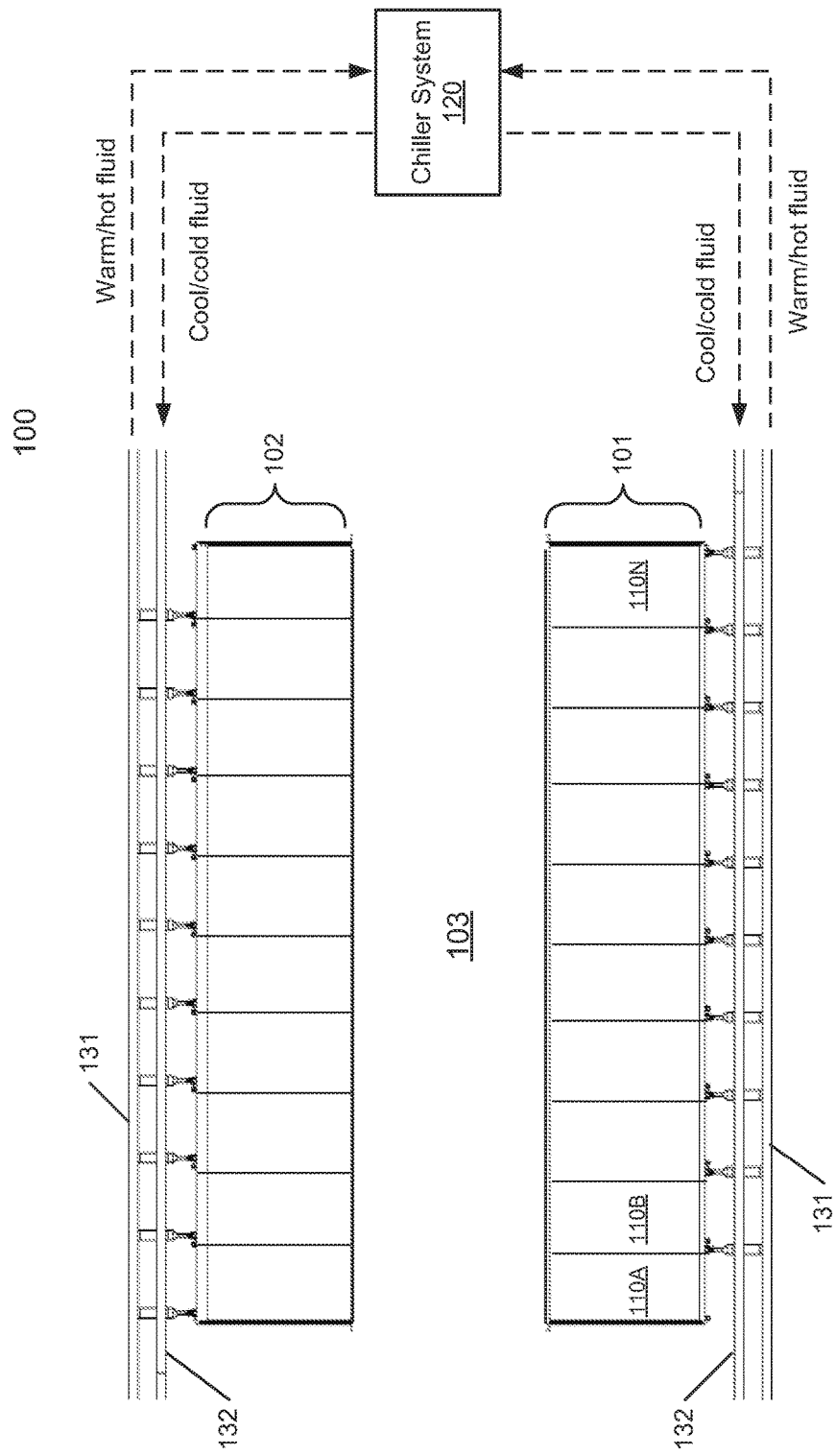
FIGS. 1 is a block diagram illustrating a data center system according to one embodiment of the invention.

FIGS. 1 is a block diagram illustrating a data center system according to one embodiment of the invention. In this example, FIG. 1 shows a top view of at least a portion of a data center. Referring to FIG. 1, according to one embodiment, data center system 100 includes rows of electronic racks of IT components, equipment or instruments 101-102, such as, for example, computer servers that provide data services to a variety of clients. In this embodiment, data center system 100 includes electronic racks arranged in row 101 and row 102. However, more or fewer rows of electronic racks may be implemented. Typically, rows 101-102 are aligned in parallel with frontends facing each other and backends facing away from each other, forming aisle 103 in between to allow an administrative person walking therein.

Each of rows 101-102 includes an array of rack slots (e.g., vertical slots) to host electronic racks, such as electronic racks 110A to 110N. An electronic rack having a stack of IT components therein can slide in and out of a rack slot. Typically, an electronic rack includes a frontend and a backend. Alternatively, the frontends of the electronic racks are facing away from each other while backends are facing towards each other. Typically, the frontend can be used to access the IT components, such as network connectors of the IT components, while the backend is used to access one or more cooling fans and/or heat exchange units mounted therein configured to blow cool air into an airspace between the IT components for the purpose of heat exchange. An IT personnel or operator can walk into aisle 103 to access the frontends or backends of the electronic racks, dependent upon the specific configuration.

According to one embodiment, each of the electronic rack includes a cooling unit mounted on the backend of the electronic rack. The cooling unit includes a fan unit and a heat exchange unit. The fan unit generates an air flow past through the air space of the IT components, carrying the heat generated from the IT components. The heat exchange unit is to exchange the heat from the air flow using cooling liquid flowing or traveling within the heat exchange unit, which transforms the hot air received from the fan unit into cool air. A heat exchange unit is to receive first liquid (e.g., cold or cool liquid) from chiller system or chiller unit 120 via first liquid channel 131 (also referred to as a cold/cool liquid channel or supply line). The cooling unit is to exchange heat generated from the IT components using the first liquid, where the exchanged heat transforms the first liquid into second liquid having a higher temperature (e.g., hot or warm liquid). The heat exchange unit then transmits the second liquid back to chiller system 120 via liquid channel 132 (also referred to as a hot/warm liquid channel or supply line). In one embodiment, a fan unit and a heat exchange unit are configured as modular units that can be detachably mounted on the backend of an electronic rack. Liquid supply lines 131-132 are referred to as data center liquid supply lines (e.g., global liquid supply lines), which supply liquid to all of the electronic racks of rows 101-102.

Figure 2:
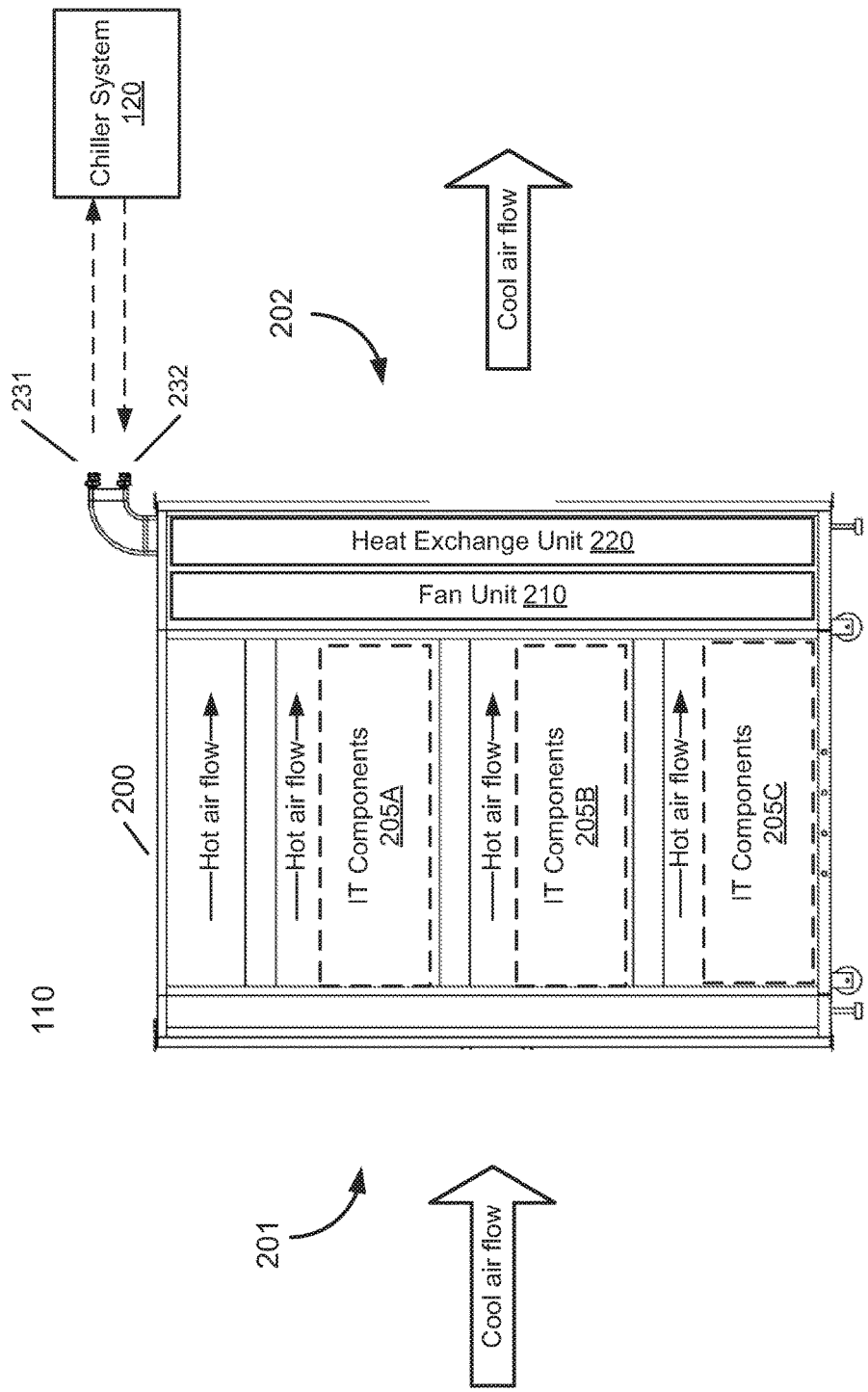
FIG. 2 is a block diagram illustrating an example of an electronic rack according to one embodiment of the invention.

FIG. 2 is a block diagram illustrating an example of an electronic rack according to one embodiment of the invention. Electronic rack 110 can represent any of the electronic racks as shown in FIG. 1. Referring to FIG. 2, electronic rack 110 includes a rack housing 200 having a frontend 201 and a backend 202. The rack housing 200 is configured to house a stack of IT components 205A-205B. An IT component may operate as a server to provide data services to a variety of clients over a network. For example, an IT component may operate as a Web or cloud server, a storage server, an application server, a backend server, or any other appliance devices.

In one embodiment, electronic rack 110 further includes fan unit 210 and heat exchange unit 220 mounted on the backend of IT components 205A-205C. Specifically, in this example, fan unit 210 is mounted adjacent to the backend of IT components 205A-205C, while heat exchange unit 220 is mounted on the exterior side of fan unit 210. As a result, in this example, fan unit 210 generates an air flow flowing from frontend 201 to backend 202, through an air space between IT components 205A-205C. The air flow carries the heat generated from IT components 205A-205C in a form of hot air flow. The heat is then exchanged by heat exchange unit 220 to transform the hot air flow into a cool air flow out of the backend 202 of electronic rack 110.

In one embodiment, fan unit 210 and/or heat exchange unit 220 are configured as one or more modular units that can be mounted and removed from backend 202 of electronic rack 110. Fan unit 210 may further includes one or more fan modules that can also be independently mounted and removed, for example, for the purpose of easy maintenance. Each fan module may further include one or more individual fans or fan devices. Similarly, heat exchange unit 220 includes one or more heat exchange modules that can be independently mounted and removed. Each heat module may be associated with one or more fan modules or one or more individual fans of a fan module.

In one embodiment, heat exchange unit 220 includes one or more tubes or pipes coupled to liquid or fluid supply lines 231-232, for example, via a pair of connectors such as blind mate connectors. Liquid supply lines 231-232, also referred to as rack supply lines, may be coupled to data center liquid supply lines 131-132, which are coupled to chiller system 120, to supply cool liquid to multiple electronic racks of a data center. Supply line 232 is configured to supply cool liquid (through data center supply line 131) to heat exchange unit 220 to exchange the heat generated from IT components 205A-205C and carried by the hot air flow generated by fan unit 210. The cool liquid transforms into a warm or hot liquid carrying the exchanged heat back to the chiller system via supply line 231 (and through data center supply line 131). As a result the how air flow only travels within the electronic rack 110, while the exterior environment surrounding electronic rack 110 remains in a cooler temperature due to heat exchange unit 220.

A heat exchanger is a device used to transfer heat between one or more fluids or liquid. The fluids may be separated by a solid wall to prevent mixing or they may be in direct contact. For efficiency, heat exchangers are designed to maximize the surface area of the wall between the fluids, while minimizing resistance to fluid flowing through the exchanger. The exchanger's performance can also be affected by the addition of fins or corrugations in one or both directions, which increase a surface area and may channel fluid flow or induce turbulence. Similar to an air conditioning system, a chiller system such as chiller system 120 is a machine that removes heat from a liquid via a vapor-compression or absorption refrigeration cycle. This liquid can then be circulated through a heat exchanger to cool air. Dependent upon the specific requirement of cool air, a control system (not shown) may be configured to control or adjust cool air with desired temperature and/or moisture. Note that the configuration as shown in FIG. 2 has been described for the purpose of illustration only. Other configurations may also be applied.

Figure 3:
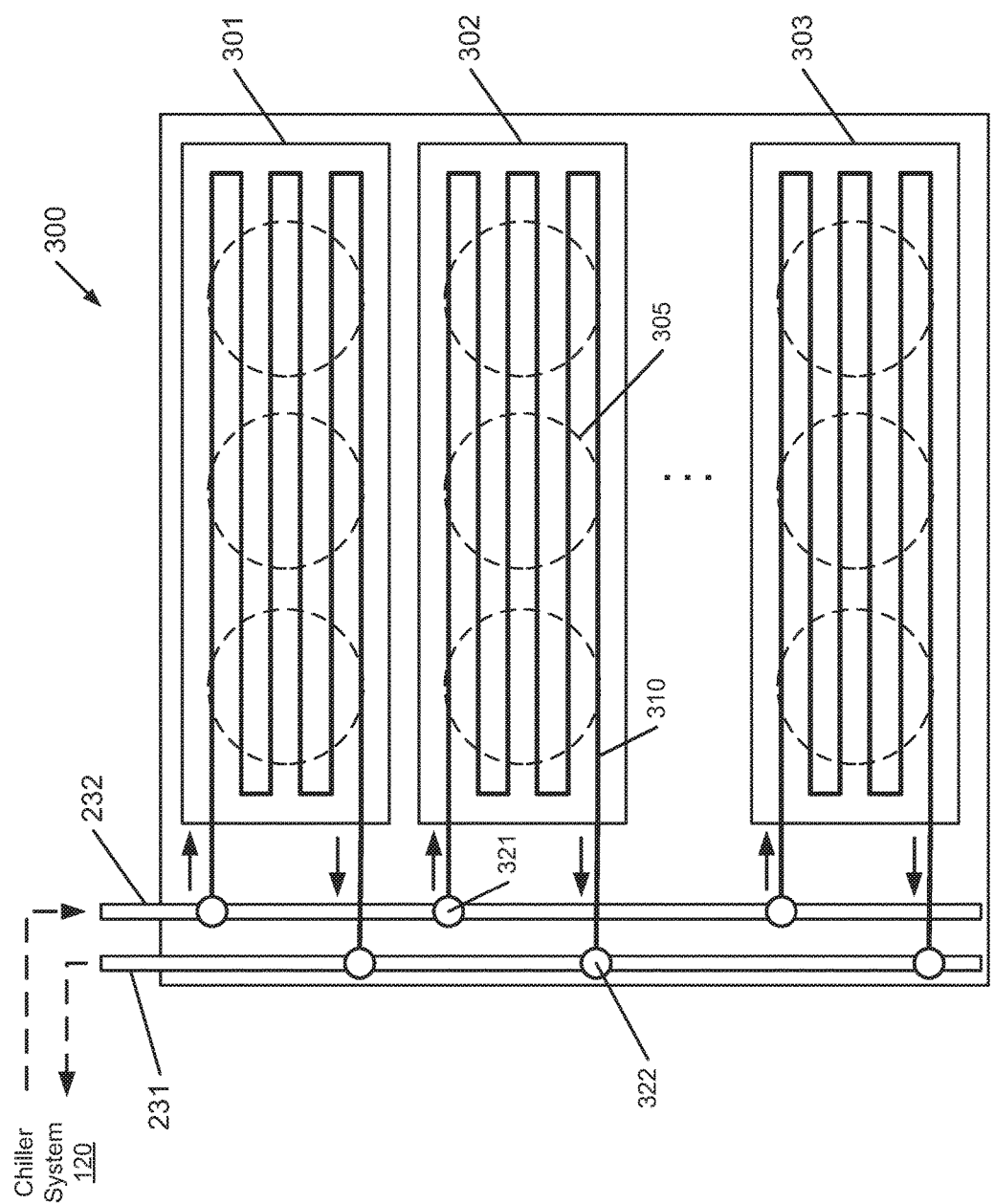
FIG. 3 is a block diagram illustrating an example of a cooling unit of an electronic rack according to one embodiment of the invention.

FIG. 3 is a block diagram illustrating a heat exchange unit according to one embodiment of the invention. FIG. 3 represents a view from a backend of an electronic rack from which heat exchange unit 300 is mounted, such as backend 202 of electronic rack 110 of FIG. 2. Heat exchange unit 300 may represent heat exchange unit 220 of FIG. 2. Referring to FIG. 3, in one embodiment, heat exchange unit 300 includes an array of heat exchange modules 301-303. Each heat exchange module corresponds to one of fan modules forming a fan unit such as fan unit 210. Each fan module includes one or more individual fans, in this example, three individual fans represented by dotted circles, such as dotted circle 305.

Each of heat exchange modules 301-303 includes one or more tubes or pipes, such as tube 310, to receive cooling liquid from intake rack supply line 232, to allow the liquid travel through the tube to exchange the heat carried by an air flow generated by a fan module. Each heat exchange modules 301-303 may further includes a heat sink having one or more heat sink fins attached to the tubes to radiate cool air from the cool liquid flowing therein and to exchange heat from the air flow. A heat sink may be made of any heat conductive material such as metal. In this example, rack supply line 232 is to supply cool liquid from an external chiller system to heat exchange modules 301-303, while rack supply line 231 is to transmit the warm or hot liquid from heat exchange modules 301-303 to the external chiller system.

In one embodiment, each tube of each heat exchange module includes an inlet end coupled to intake supply line 232 via a connector such as connector 321 and an outlet end coupled to outtake supply line 231 via a connector such as connector 322. The inlet end of a tube is to receive cooler liquid from the chiller system, while the outlet end of the tube is to transmit warmer liquid carrying the exchanged heat back to the chiller system. Connectors 321-322 may be blind mate connectors that can be used to couple two tubes together by plugging in and pulling out without leaking the liquid within the tubes. In one embodiment, each of the tubes in heat exchange modules 301-303 is coupled to rack supply lines 231-232 via a flexible tube or flexible tubing mechanism that can be plugged into and unplugged from each other, for example, for the installing and removing the corresponding heat exchange module, without leaking the liquid therein.

According to one embodiment, each of heat exchange modules 301-303 is further associated with a heat exchange controller (e.g., a liquid flow controller, not shown) to control a liquid flow rate of fluid traveling within one or more tubes of the heat exchange module. The controller may be configured to independently control the liquid flow rate based on the temperature of an air flow generated from the corresponding fan module and/or the temperature of the associated IT component(s), which may be sensed by one or more temperature sensors deployed in various locations (not shown). Similarly, each of the fan modules is associated with a fan controller (e.g., an airflow controller, not shown) to individually control an air flow generated by the fan module (e.g., by controlling the speed of the fans) based on the temperature of the corresponding IT component(s) and/or the temperature of the air flow. The heat exchange controller and fan controller may coordinate with each other to reduce the temperature of the IT components.

Figure 4B:
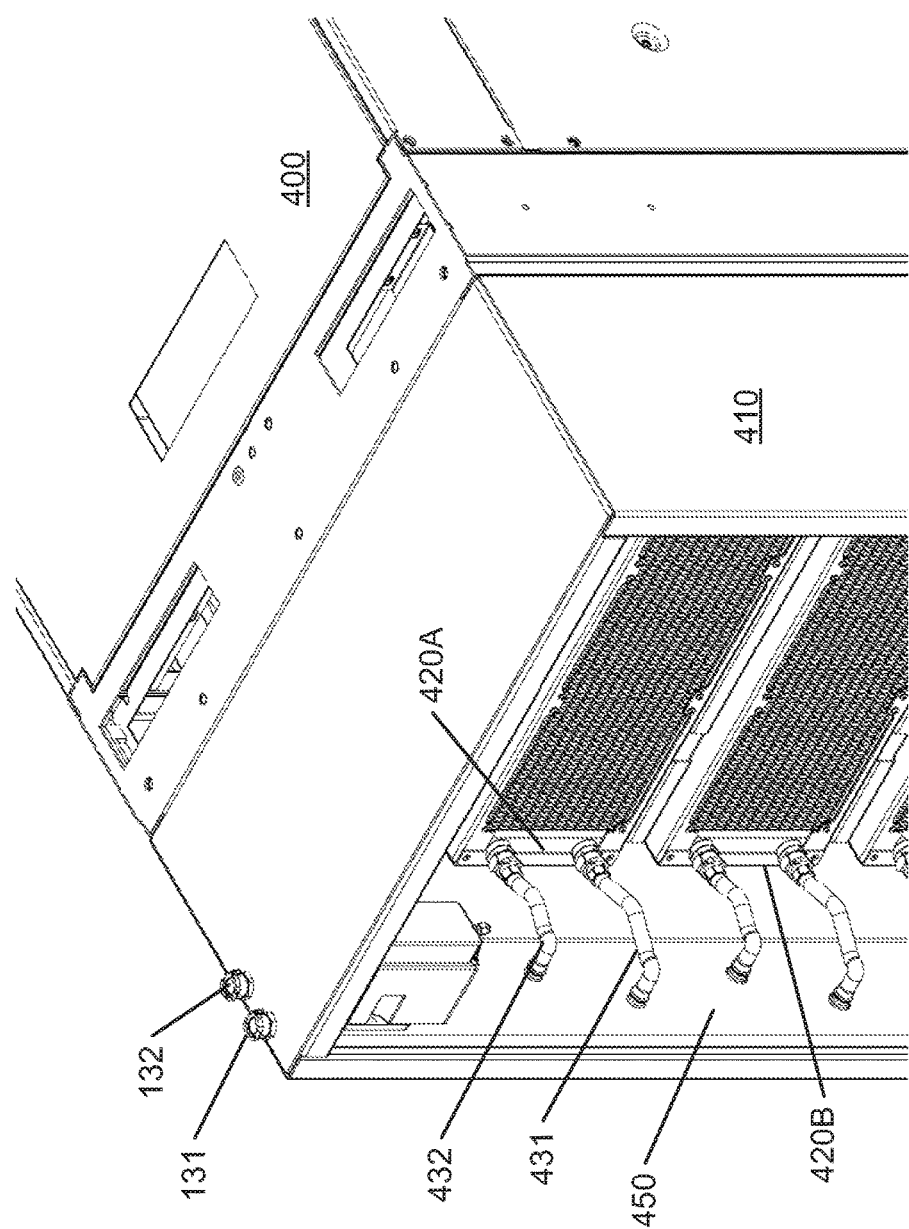

FIGS. 4A and 4B show a perspective view of an electronic rack according to one embodiment of the invention. Referring to FIG. 4A, electronic rack 400 includes frontend 401 and backend 402, where electronic rack 400 may be implemented as electronic rack 110 as shown in FIG. 2. In addition, electronic rack 400 includes cooling unit 410 mounted on backend 402. In one embodiment, cooling unit 410 includes a heat exchange unit and a fan unit, which may be implemented as part of the cooling unit as shown in FIG. 3. As described above, the heat exchange unit includes one or more heat exchange modules. The fan unit includes one or more fan modules and each fan module includes one or more fans. A heat exchange module may correspond to one fan module. Alternatively, a single heat exchange module covers one or more fan modules.

FIG. 4B shows an enlarged version of electronic rack 400 as shown in FIG. 4A. Referring to FIG. 4B, cooling unit 410 is mounted on a backend of electronic rack 400. Cooling unit 410 includes an array of heat exchange modules 420A-420B corresponding to an array of fan modules. The fan modules may be mounted between heat exchange modules 420A-420B and the backend of the IT components contained within electronic rack 400 (not shown). Each of the heat exchange modules 420A-420B includes one or more tubes arranged in a flat cooling screen as described above, where the tubes may be attached to a heat sink having one or more heat sink fins. Each tube includes an inlet end coupled to rack supply line 232 and an outlet end coupled to rack supply line 231 via a pair of flexible tubes (e.g., flexible tubes 431-432). Supply lines 231-232 are enclosed in supply line channel or enclosure 450. Any of heat exchange modules 420A-420B and its associated fan module(s) (not shown) can be mounted and removed from cooling unit 410, for example, by plugging and unplugging the corresponding flexible tubes from the heat exchange module.

Figure 5A:
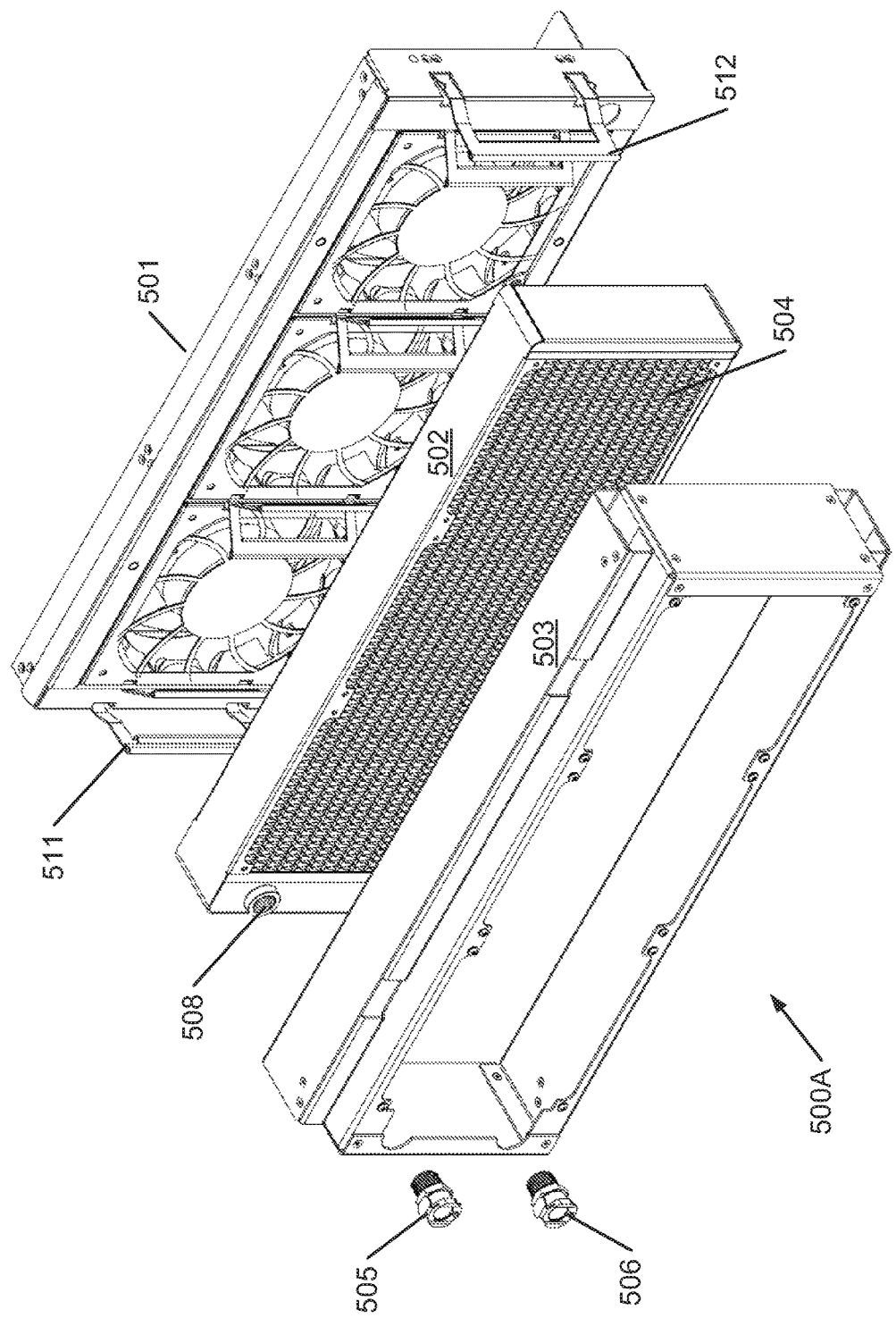
FIGS. 5A-5D are diagrams illustrating an example of a cooling unit of an electronic rack according to another embodiment of the invention.

FIGS. 5A-5D show an assembly structure representing an integrated heat exchange module and a fan module according to certain embodiments of the invention. Referring to FIG. 5A, integrated module 500, also referred to as a cooling module, includes a fan module 501, a heat exchange module 502, and a heat exchange frame 503. Cooling module 500 can be one of a number of cooling modules forming cooling unit 410 of FIGS. 4A-4B. Frame 503 formed as a rectangular well to receive heat exchange module 502 deposited and mounted therein. Frame 503 further includes a pair of cutouts to allow a pair of connectors 505-506 (e.g., blind mate connectors) extended from the ends (e.g., tube inlet and outlet ends 508-509) of a tube forming cooling screen 504 of heat exchange module 502. Connectors are utilized to connect the tube with rack supply lines 231-232.

Figure 5B:
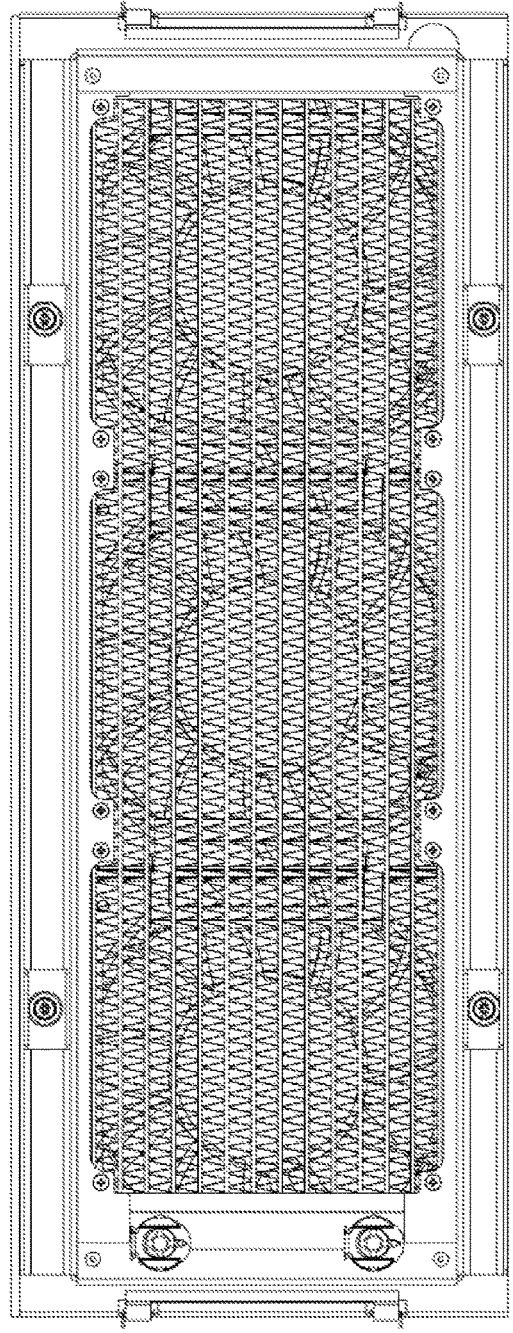
Figure 5C:
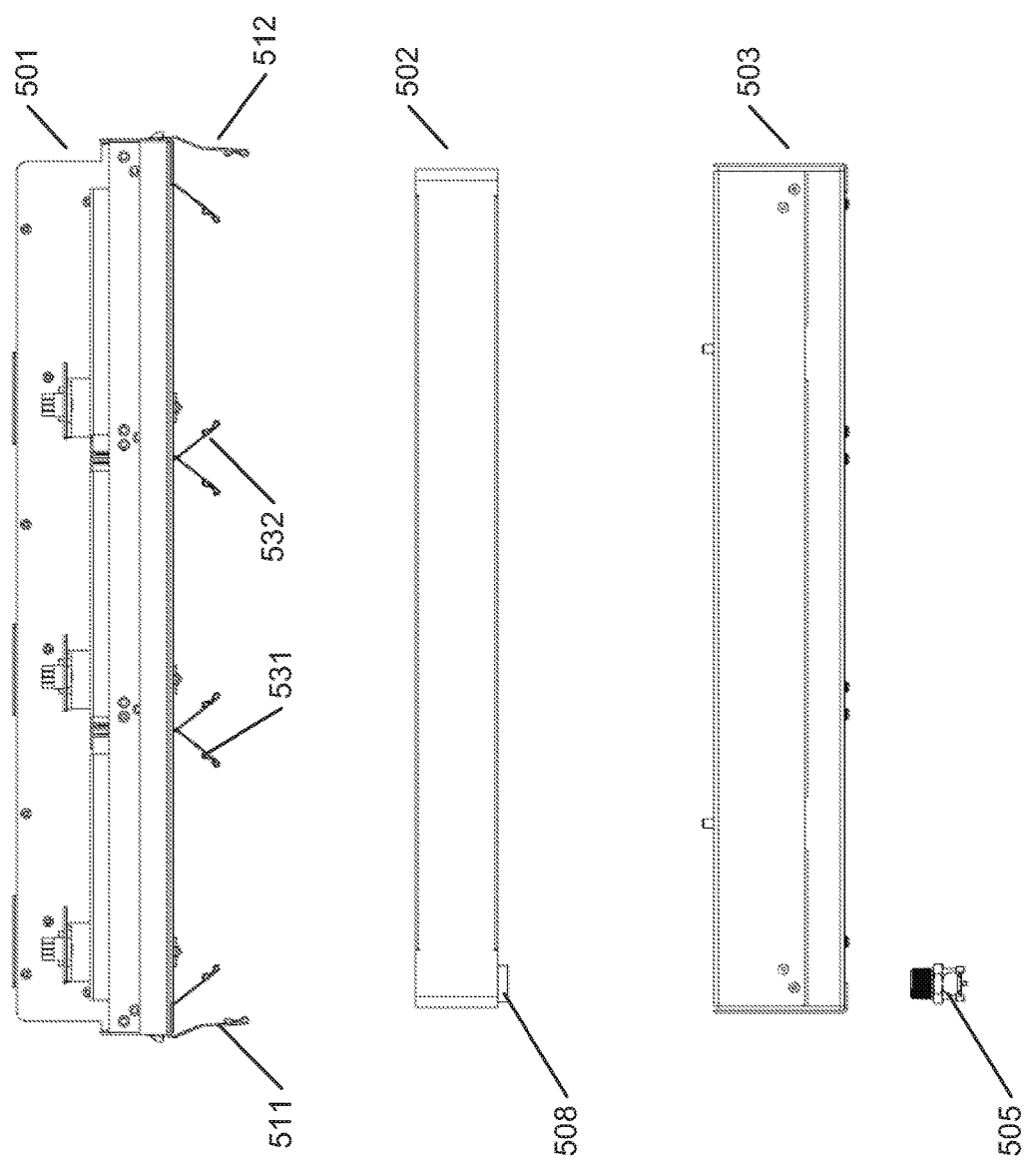
Figure 5D:
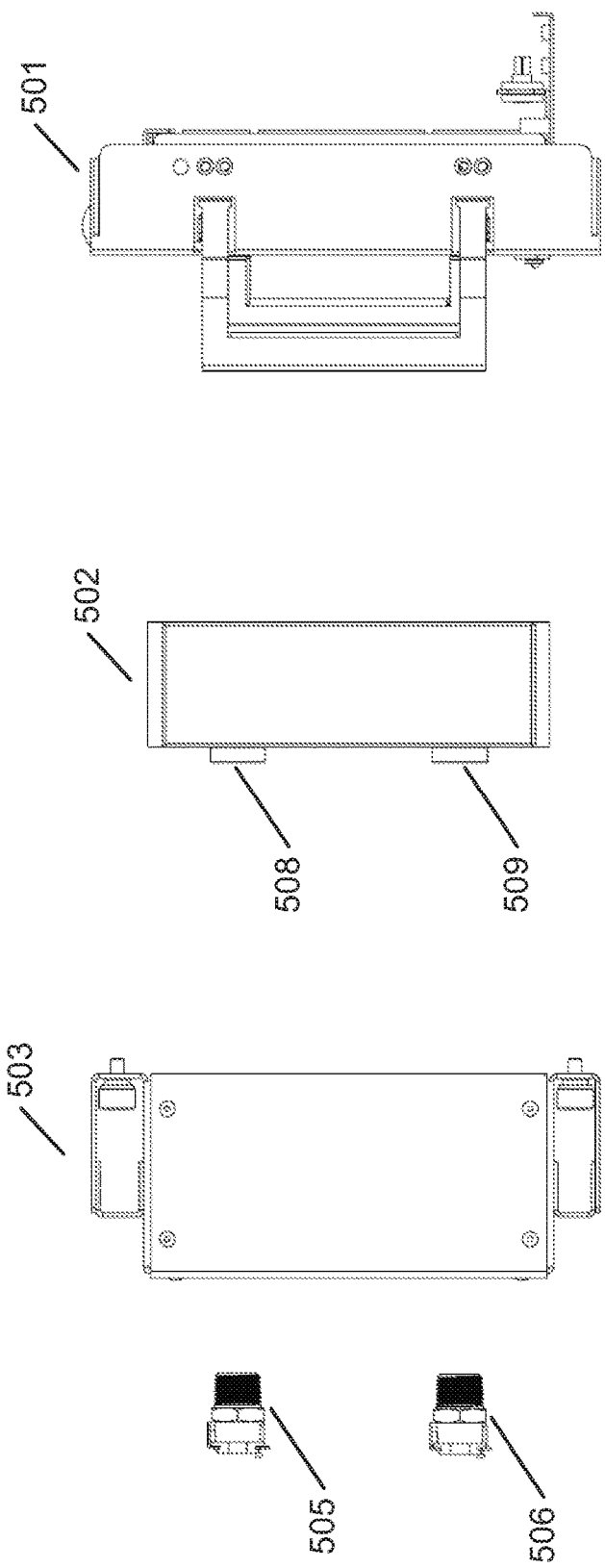

In addition, fan module 501 includes a pair of clamps or latches 511-512 attached to each side of fan module 501. Once heat exchange module 502 is deposited into frame 503, fan module 501 can be attached to frame 503 having heat exchange module 502 therein by clamping onto an edge of frame 503 via clamps 511-512. FIG. 5B shows a front view 500A of cooling unit 500 of FIG. 5A. FIG. 5C shows a top view of cooling unit 500 and FIG. 5D shows another side view of cooling unit 500. Referring to FIG. 5C, fan module 501 further includes one or more springs 531-532 that can provide a force against a surface of heat exchange module 502 outwardly when clamps 511-512 latch onto frame 503 to secure locking of the frame 503 with fan module 501.

Figure 6A:
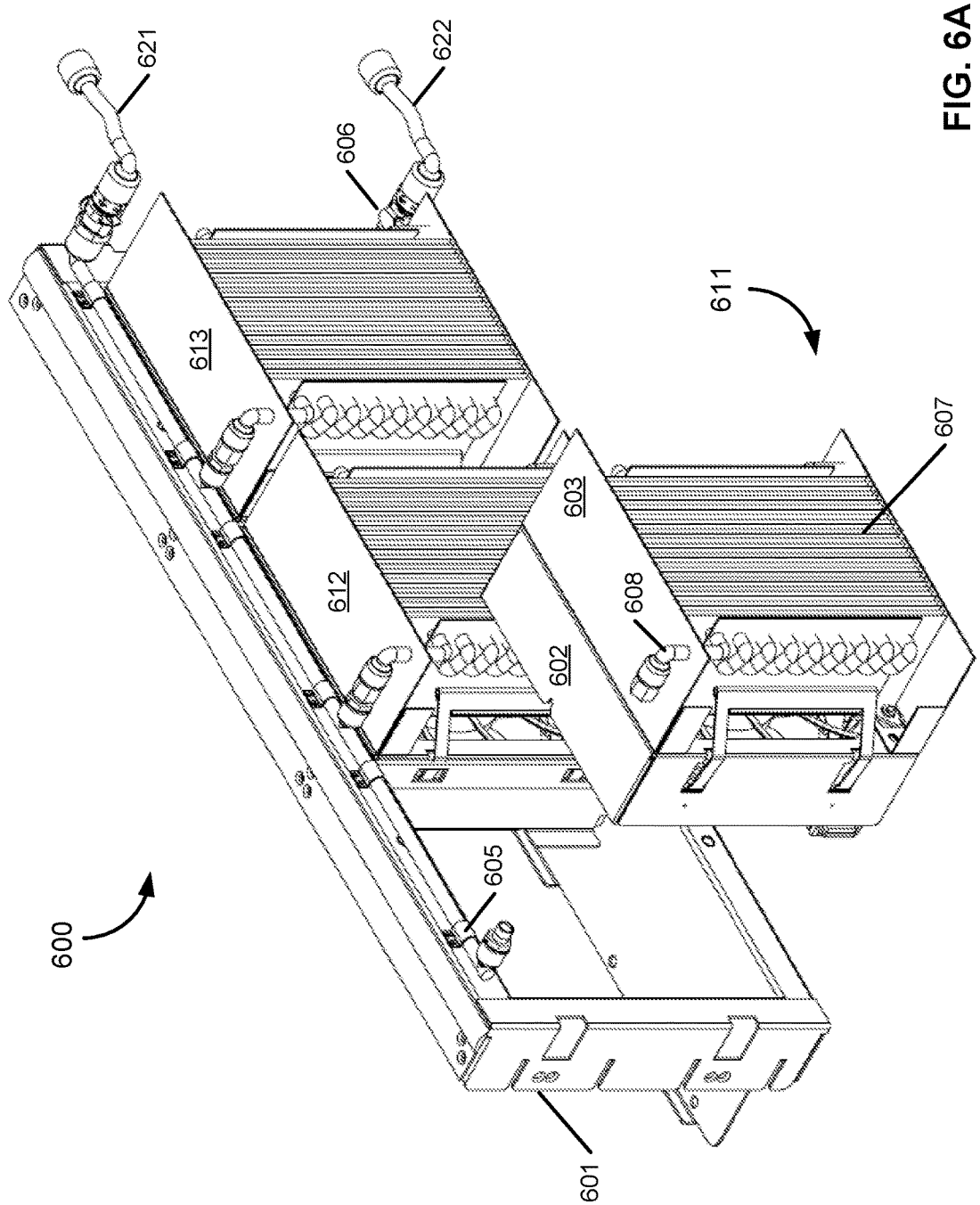
FIGS. 6A and 6B show an assembly structure representing an integrated heat exchange module and a fan module according to another embodiment of the invention.
Figure 6B:
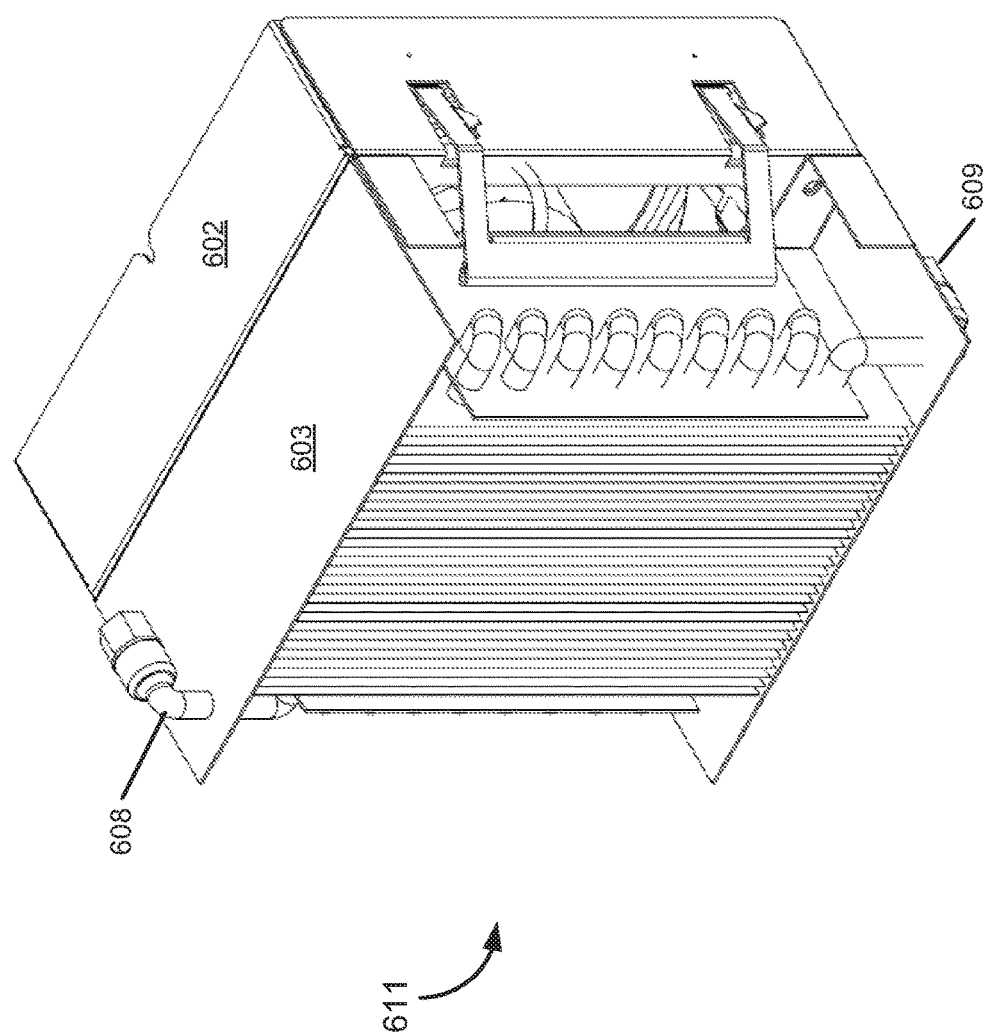

FIGS. 6A and 6B show an assembly structure representing an integrated heat exchange module and a fan module according to another embodiment of the invention. Referring to FIG. 6A, cooling module 600 may be implemented as any of the cooling modules as shown in FIGS. 4A and 4B. Referring to FIG. 6A, instead of having one heat exchange module covering multiple fans of a fan module, each fan is attached to an individual heat exchanger to form an individual cooling module. In this example, individual cooling module 611 includes fan 602 attached to heat exchanger 603 via a pair of clamps as described above. Individual cooling modules 611-613 are then mounted onto module frame 601. Module frame 601 having individual cooling modules 611-613 is then mounted onto the backend of an electronic rack, as shown in FIGS. 4A-4B. Note that in this example, there are three individual cooling modules; more or fewer individual cooling modules may also be applicable.

In one embodiment, each of the heat exchangers of individual cooling modules 611-613 includes a tube arranged in a cooling screen and optionally attached to a heat sink such as heat sink 607 of individual cooling module 611. A tube of a heat exchanger includes an inlet end and outlet end coupled to an intake module supply line and an outtake module supply line, respectively. In this example, an end of tube 608 of individual cooling module can be connected (e.g., plugged) into module supply line 605 disposed on module frame 601. The other end of the tube 609 (as shown in FIG. 6B) is also coupled to the other module supply line 606 attached to module frame 601. Module supply lines 605-606 may be coupled to corresponding rack supply lines (e.g., rack supply lines 231-232) via flexible tubes 621-622. The tubes and supply lines may be coupled to each other via connectors such as blind mate connectors.

Figure 7B:
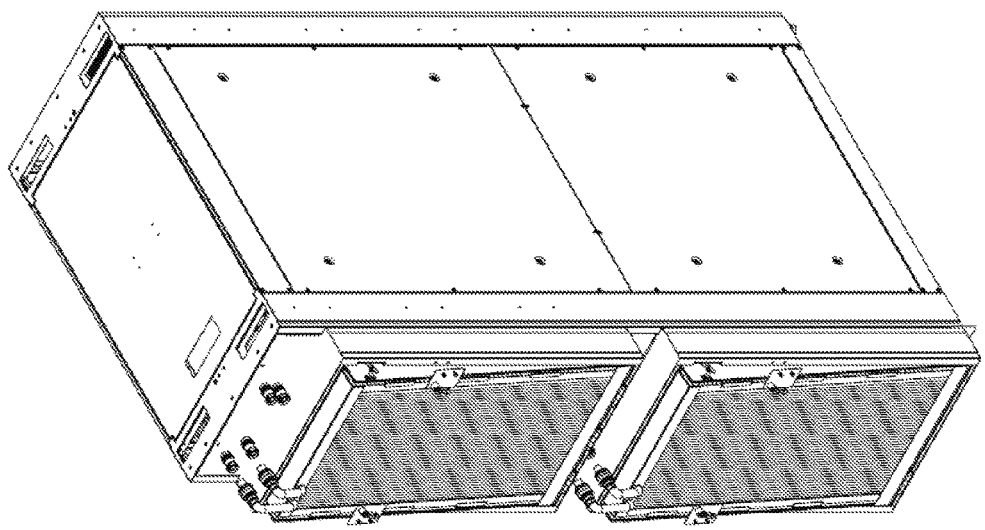
FIGS. 7A-7F show various views of an electronic rack according to another embodiment of the invention.
Figure 7A:
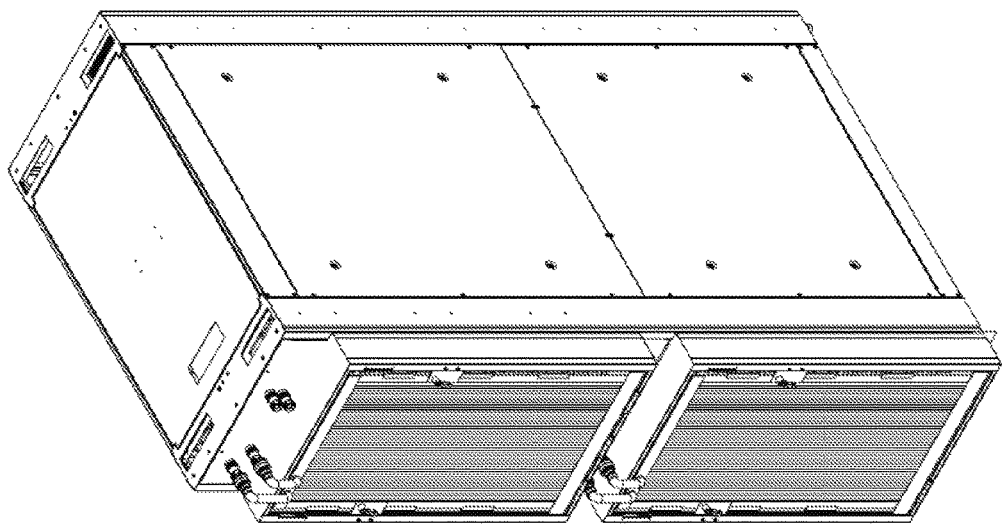
Figure 7D:
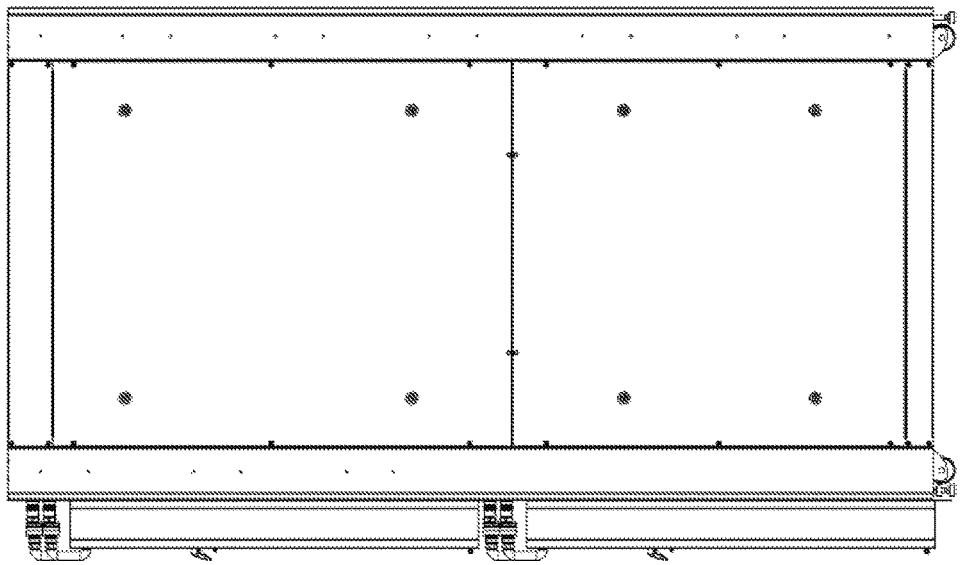
Figure 7C:
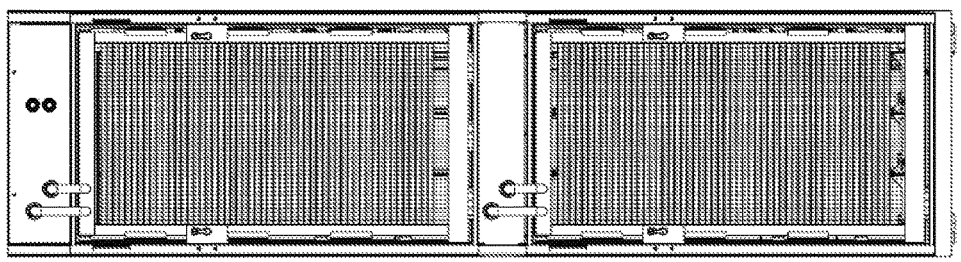
Figure 7F:
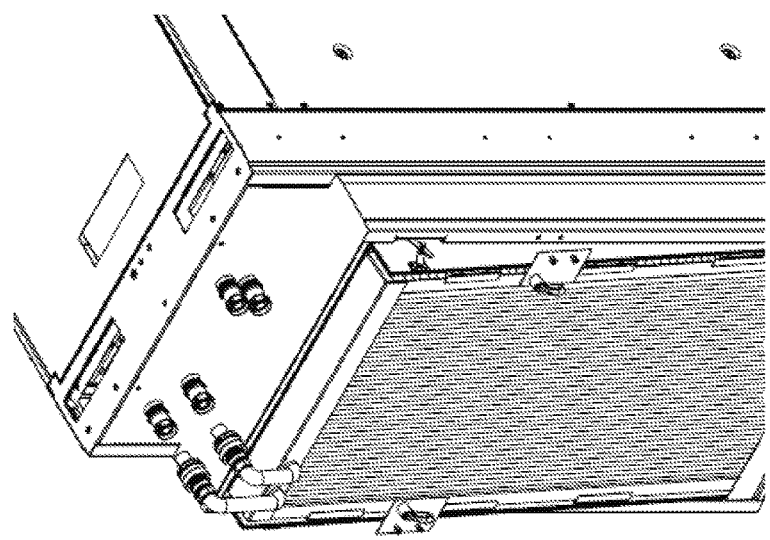
Figure 7E:
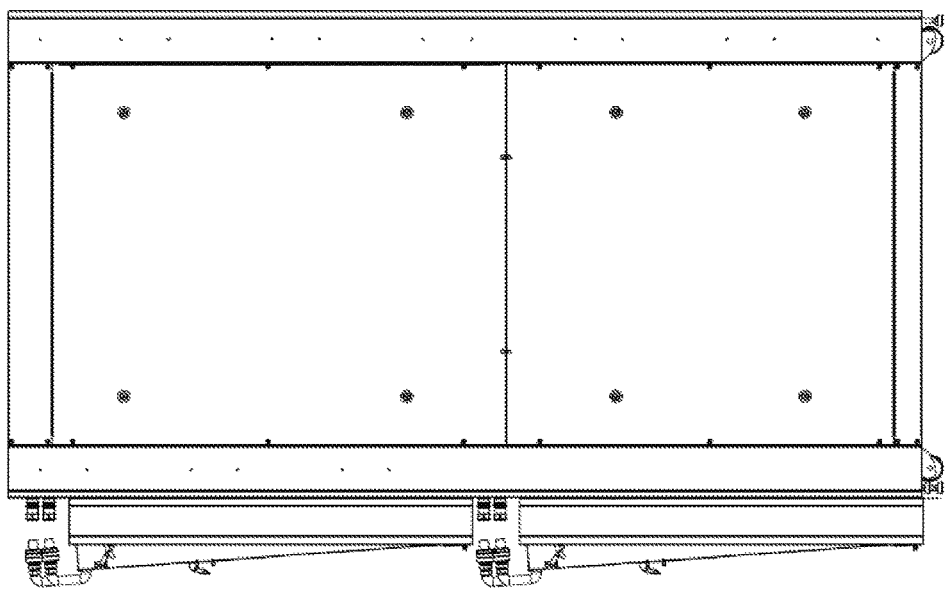

FIGS. 7A-7F show various views of an electronic rack according to another embodiment of the invention. Referring to FIGS. 7A-7F, in this embodiment, a heat exchange module corresponds to multiple fan modules (e.g., fan modules as shown in FIGS. 5A-5D). FIGS. 7A and 7B show a heat exchange module is plugged in and unplugged from rack supply lines, respectively. In this example, there are two heat exchange modules, while there are more than two fan modules covered by each of the heat exchange modules. FIG. 7C shows a back view of the electronic rack. FIG. 7D show a side view of the electronic rack in which the heat exchange modules are plugged in, while FIG. 7E shows a side view of the electronic rack in which the heat exchange modules are unplugged. FIG. 7F is an enlarged view of the electronic rack.

Thus, by configuring a heat exchange unit and fan unit into multiple modular cooling units, each cooling unit can be installed and removed independently without affecting the operations of other cooling units. Each heat exchange module and fan module of a cooling unit can be individually controlled via a respective controller to control a liquid flow rate and an airflow rate. As a result, the individual temperature of the corresponding IT component(s) can be individually controlled. The cooling efficiency can be greatly improved.

Note that the cooling techniques described above can be applied to a variety of different types of data centers, such as, for example, traditional colocation data centers and greenfield data centers. A colocation data center is a type of data center where equipment, space, and bandwidth are available for rental to retail customers. Colocation facilities provide space, power, cooling, and physical security for the server, storage, and networking equipment of other firms, and connect them to a variety of telecommunications and network service providers with a minimum of cost and complexity. A greenfield data center refers to a data center that is built and configured in a location where none exists before. The techniques described above can also be applied to or work in conjunction with a performance optimized data center (POD), or portable on-demand or container data center, where racks of servers are housed in one or more individual containers, modular rooms, or modular housings.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
a stack of a plurality of information technology (IT) components disposed therein to form a frontend and a backend of the electronic rack;
a fan unit detachably mounted on the backend of the electronic rack, the fan unit generating an air flow flowing from the frontend to the backend past through an air space of the stack of the IT components to reduce a temperature of the IT components; and
a heat exchange unit detachably mounted on the backend of the electronic rack to exchange heat generated from the IT components, the heat exchange unit having one or more tubes forming a heat exchange screen, the one or more tubes allow a cool liquid to travel therein to exchange the heat carried by the air flow past through the heat exchange screen,
wherein the fan unit comprises a plurality of fan modules, and the heat exchange unit comprises a plurality of heat exchange modules, each of the heat exchange modules corresponding to one or more of the fan modules,
wherein each of the heat exchange modules is mounted on a heat exchange frame,
wherein each of the fan modules includes a pair of clamps to attach each of the fan modules onto one of the heat exchange modules by clamping onto the heat exchange frame to form a cooling module, the pair of clamps includes a first clamp disposed on a first side of each of the fan modules and a second clamp disposed on a second side of each of the fan modules opposite to the first side, the first clamp extends outwardly to clamp onto a first edge of the heat exchange frame, and the second clamp extends outwardly to clamp onto a second edge of the heat exchange frame opposite to the first edge,
wherein each of the fan modules further comprises one or more springs attached thereon and extended outwardly in an identical direction of the pair of clamps associated with each of the fan modules, and
wherein the cooling module is then mounted onto the backend of the electronic rack.

2. The electronic rack of claim 1, wherein each of the fan modules comprises a plurality of fan devices forming an array of individual fans.

3. The electronic rack of claim 1, further comprising a first liquid supply line and a second liquid supply line, wherein the first liquid supply line is to supply the cool liquid from a chiller system into the heat exchange unit and the second liquid supply line is to transmit warm liquid carrying the exchanged heat from the heat exchange unit back to the chiller system.

4. The electronic rack of claim 3, wherein the chiller system provides the cool liquid to a plurality of electronic racks including the electronic rack.

5. The electronic rack of claim 3, wherein each of the heat exchange modules comprises one of the tubes arranged as a part of the heat exchange screen, the one of the tubes including an inlet end and an outlet end, the inlet end is configured to be coupled to the first liquid supply line to intake the cool liquid, and the outlet end is configured to be coupled to the second liquid supply line to transmit the warm liquid back to the chiller system.

6. The electronic rack of claim 5, wherein the inlet end of the one of the tubes is coupled to the first liquid supply line via a first tube connector, and the outlet end of the one of the tubes is coupled to the second liquid supply line via a second tube connector.

7. The electronic rack of claim 5, wherein each of the first and second liquid supply lines includes a plurality of tube connectors, each of the tube connectors corresponding to the one of the heat exchange modules via a flexible tubing mechanism connecting the one of the heat exchange modules to the first and second liquid supply lines.

8. The electronic rack of claim 5, wherein each of the heat exchange modules is associated with a heat exchange controller to individually control a liquid flow rate of each of the heat exchange modules.

9. The electronic rack of claim 5, wherein each of the fan modules is associated with a fan controller to individually control an airflow rate of each of the fan modules.

10. The electronic rack of claim 1, wherein the first clamp comprises a first U-shape latch configured to latch onto the first edge of the heat exchange frame, and the second clamp comprises a second U-shape latch configured to latch onto the second edge of the heat exchange frame.

11. The electronic rack of claim 10, wherein the first U-shape latch having a first center portion and first end terminals extending from opposing sides of the first center portion, the first end terminals of the first U-shape latch are fixedly attached to the first side of each of the fan modules, and the first center portion of the first U-shape latch is configured to latch on the first edge of the heat exchange frame.

12. The electronic rack of claim 11, wherein the second U-shape latch having a second center portion and second end terminals extending from opposing sides of the second center portion, the second end terminals of the second U-shape latch are fixedly attached to the second side of each of the fan modules, the second center portion of the second U-shape latch is configured to latch on the second edge of the heat exchange frame.

13. The electronic rack of claim 1, wherein when each of the fan modules is attached to the heat exchange frame of a corresponding one of the heat exchange modules, the one or more springs of each of the fan modules is pressed against a surface of the corresponding one of the heat exchange modules to provide a separation force between each of the fan modules and the corresponding one of the heat exchange modules, while the pair of clamps of the fan module latches onto the corresponding one of the heat exchange modules to provide a closing force for secure locking of each of the fan modules with the heat exchange frame of the corresponding one of the heat exchange modules.

14. A data center system, comprising:
an array of electronic racks, each of the electronic racks including:
a stack of a plurality of information technology (IT) components disposed therein to form a frontend and a backend of the electronic rack,
a fan unit detachably mounted on the backend of the electronic rack, the fan unit generating an air flow flowing from the frontend to the backend past through an air space of the stack of the IT components to reduce a temperature of the IT components, and the fan unit comprises a plurality of fan modules, and
a heat exchange unit detachably mounted on the backend of the electronic rack to exchange heat generated from the IT components, the heat exchange unit comprises a plurality of heat exchange modules, each of the heat exchange modules corresponding to one of the fan modules, each of the heat exchange modules having one or more tubes forming a heat exchange screen, the one or more tubes allow a cool liquid to travel therein to exchange the heat carried by the air flow past through the heat exchange screen, and each of the heat exchange modules is mounted on a heat exchange frame,
wherein each of the fan modules includes a pair of clamps to attach each of the fan modules onto a respective one of the heat exchange modules by clamping onto the heat exchange frame to form a cooling module, the pair of clamps includes a first clamp disposed on a first side of each of the fan modules and a second clamp disposed on a second side of each of the fan modules opposite to the first side, the first clamp extends outwardly to clamp onto a first edge of the heat exchange frame, and the second clamp extends outwardly to clamp onto a second edge of the heat exchange frame opposite to the first edge,
wherein each of the fan modules further comprises one or more springs attached thereon and extended outwardly in an identical direction of the pair of clamps associated with each of the fan modules, and
wherein the cooling module is then mounted onto the backend of the electronic rack.

15. The data center system of claim 14, wherein each of the fan modules comprises a plurality of fan devices forming an array of individual fans.

16. The data center system of claim 14, wherein each of the electronic racks further comprises a first liquid supply line and a second liquid supply line, the first liquid supply line is to supply the cool liquid from a chiller system into the heat exchange unit and the second liquid supply line is to transmit warm liquid carrying the exchanged heat from the heat exchange unit back to the chiller system.

17. The data center system of claim 16, wherein the chiller system provides the cool liquid to the array of electronic racks.

18. The data center system of claim 16, wherein each of the heat exchange modules comprises one of the tubes arranged as a part of the heat exchange screen, the one of the tubes including an inlet end and an outlet end, the inlet end is configured to be coupled to the first liquid supply line to intake the cool liquid, and the outlet end is configured to be coupled to the second liquid supply line to transmit the warm liquid back to the chiller system.

19. The data center system of claim 18, wherein the inlet end of the one of the tubes is coupled to the first liquid supply line via a first tube connector, and the outlet end of the one of the tubes is coupled to the second liquid supply line via a second tube connector.

20. The data center system of claim 18, wherein each of the first and second liquid supply lines includes a plurality of tube connectors, each of the tube connectors corresponding to the respective one of the heat exchange modules via a flexible tubing mechanism connecting the respective one of the heat exchange modules to the first and second liquid supply lines.

21. The data center system of claim 14, wherein the first clamp comprises a first U-shape latch configured to latch onto the first edge of the heat exchange frame, and the second clamp comprises a second U-shape latch configured to latch onto the second edge of the heat exchange frame.

22. The data center system of claim 21, wherein the first U-shape latch having a first center portion and first end terminals extending from opposing sides of the first center portion, the first end terminals of the first U-shape latch are fixedly attached to the first side of each of the fan modules, and the first center portion of the first U-shape latch is configured to latch on the first edge of the heat exchange frame.

23. The data center system of claim 22, wherein the second U-shape latch having a second center portion and second end terminals extending from opposing sides of the second center portion, the second end terminals of the second U-shape latch are fixedly attached to the second side of each of the fan modules, the second center portion of the second U-shape latch is configured to latch on the second edge of the heat exchange frame.

24. The data center system of claim 14, wherein when each of the fan modules is attached to the heat exchange frame of a corresponding one of the heat exchange modules, the one or more springs of each of the fan modules is pressed against a surface of the corresponding one of the heat exchange modules to provide a separation force between each of the fan modules and the corresponding one of the heat exchange modules, while the pair of clamps of the fan module latches onto the corresponding one of the heat exchange modules to provide a closing force for secure locking of each of the fan modules with the heat exchange frame of the corresponding one of the heat exchange modules.

\* \* \* \* \*